United States Patent
Ohsawa

(10) Patent No.: US 7,430,041 B2
(45) Date of Patent: *Sep. 30, 2008

(54) SEMICONDUCTOR STORAGE APPARATUS

(75) Inventor: Takashi Ohsawa, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/779,055

(22) Filed: Jul. 17, 2007

(65) Prior Publication Data

US 2007/0258294 A1    Nov. 8, 2007

Related U.S. Application Data

(63) Continuation of application No. 11/092,904, filed on Mar. 30, 2005, now Pat. No. 7,251,179.

(30) Foreign Application Priority Data

Aug. 31, 2004    (JP) .............................. 2004-253070

(51) Int. Cl.
*G11C 11/406* (2006.01)

(52) U.S. Cl. ...................... 356/222; 365/195

(58) Field of Classification Search .................. 365/195
See application file for complete search history.

(56) References Cited

U.S. PATENT DOCUMENTS

| | | | |
|---|---|---|---|
| 3,790,961 A | | 2/1974 | Palfi et al. |
| 4,758,992 A | * | 7/1988 | Taguchi ....................... 365/222 |
| 4,827,453 A | | 5/1989 | Sawada et al. |
| 4,829,484 A | | 5/1989 | Arimoto et al. |
| 4,985,868 A | * | 1/1991 | Nakano et al. .............. 365/222 |
| 5,345,374 A | | 9/1994 | Sato et al. |
| 5,828,619 A | * | 10/1998 | Hirano et al. ............... 365/222 |
| 6,240,032 B1 | | 5/2001 | Fukumoto |
| 6,275,895 B1 | | 8/2001 | Tabo |
| 6,545,943 B2 | | 4/2003 | Mizugaki et al. |
| 6,621,725 B2 | | 9/2003 | Ohsawa |
| 6,636,449 B2 | * | 10/2003 | Matsuzaki ................... 365/222 |
| 6,813,203 B2 | | 11/2004 | Nakagawa |
| 6,920,524 B2 | * | 7/2005 | Lovett ........................ 711/106 |
| 6,956,777 B2 | * | 10/2005 | Komura et al. .............. 365/200 |
| 7,113,441 B2 | | 9/2006 | Shinozaki et al. |
| 7,292,490 B1 | * | 11/2007 | Shu et al. .................... 365/222 |
| 2002/0001247 A1 | | 1/2002 | Kim et al. |
| 2002/0051396 A1 | | 5/2002 | Higashiho et al. |
| 2002/0057607 A1 | | 5/2002 | Mizugaki et al. |

(Continued)

FOREIGN PATENT DOCUMENTS

EP    1 150 301 A1    10/2001

(Continued)

OTHER PUBLICATIONS

Patent Abstract of Japan, JP 58-091593, May 31, 1983.

*Primary Examiner*—Tan T. Nguyen
(74) *Attorney, Agent, or Firm*—Oblon, Spivak, McClelland, Maier & Neustadt, P.C.

(57) ABSTRACT

A semiconductor storage apparatus according to one embodiment of the present invention, comprising: memory cells which need refresh operation; and a refresh control circuit which suspends the refresh operation when external access for reading out from or writing into the memory cells is requested.

18 Claims, 14 Drawing Sheets

U.S. PATENT DOCUMENTS

| | | |
|---|---|---|
| 2003/0123298 A1 | 7/2003 | Kato |
| 2004/0052142 A1 | 3/2004 | Ikehashi et al. |

FOREIGN PATENT DOCUMENTS

| | | |
|---|---|---|
| JP | 61-129797 | 6/1986 |
| JP | 63-166093 | 7/1988 |
| JP | 2002-050175 | 2/2002 |
| WO | 2004-027780 | 4/2004 |

* cited by examiner

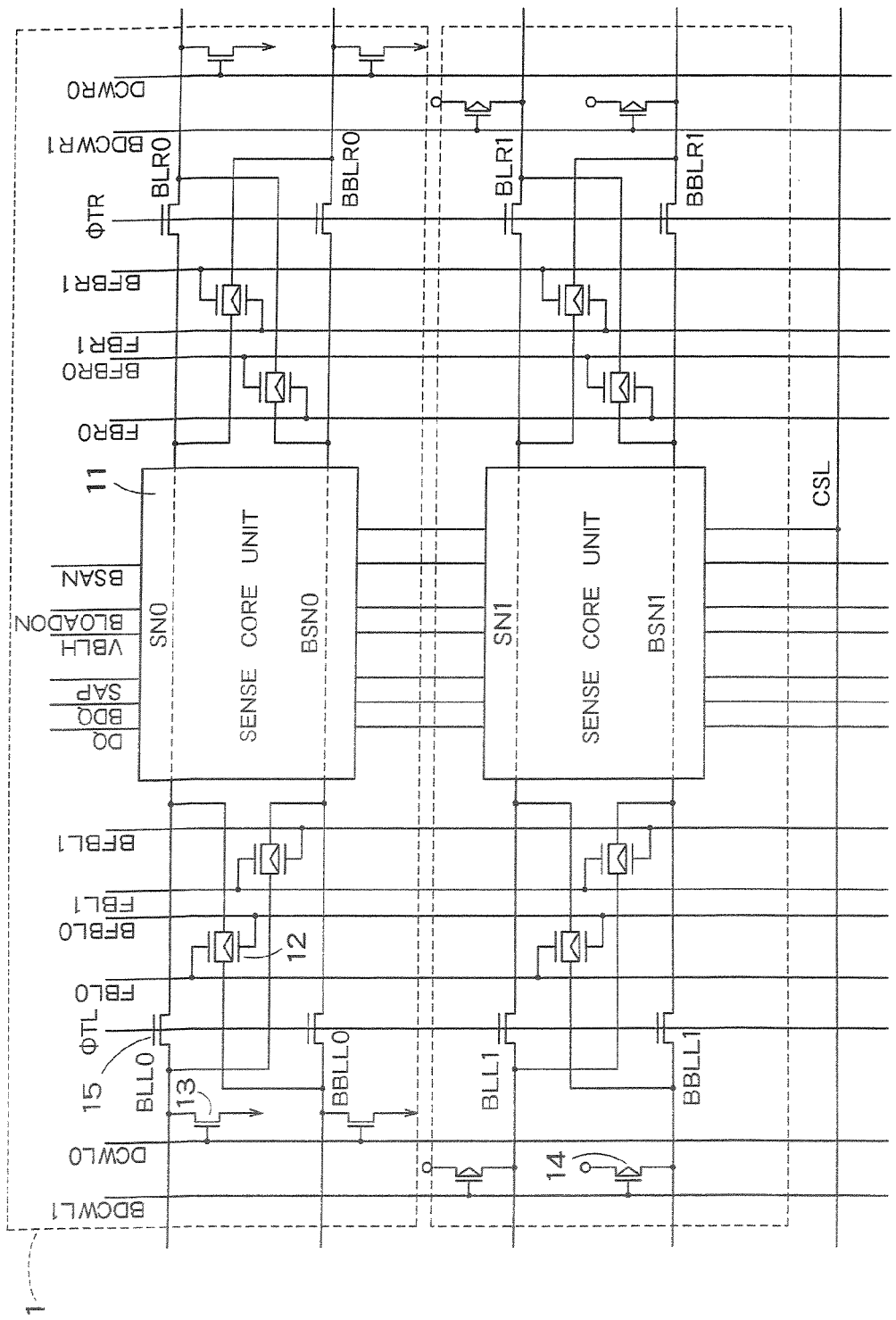
F I G. 2

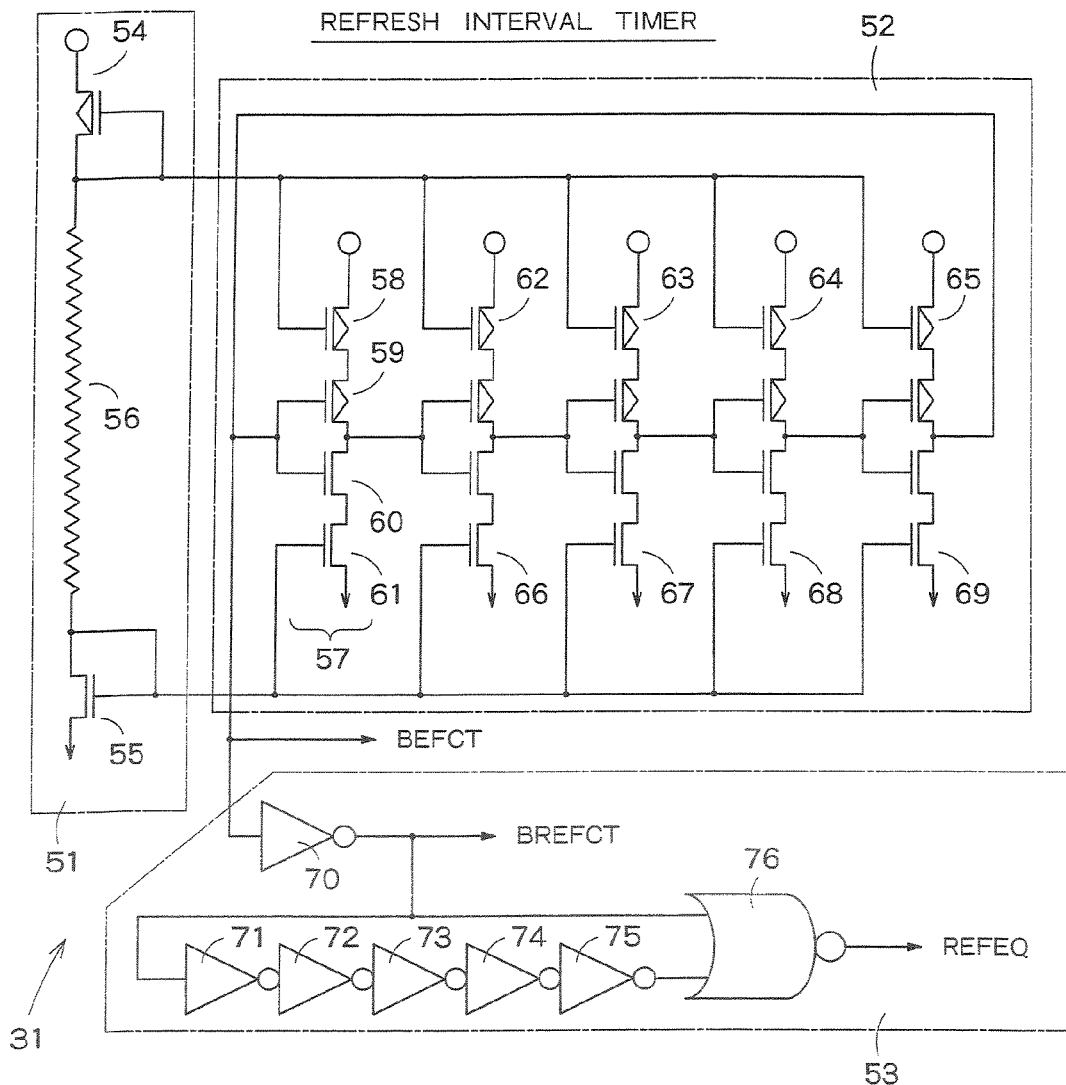
F I G. 5
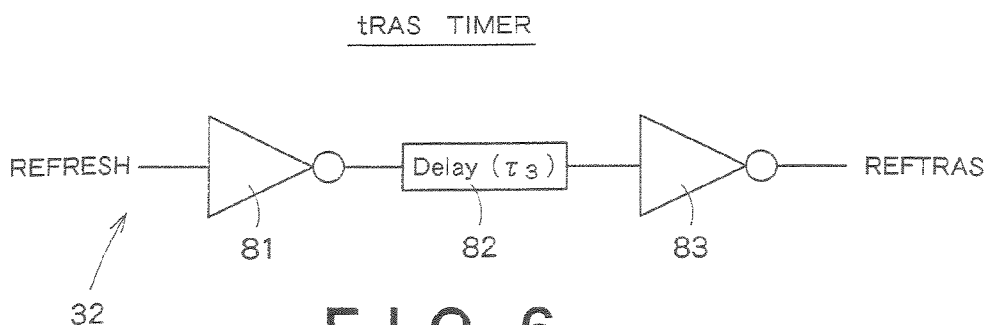
F I G. 6

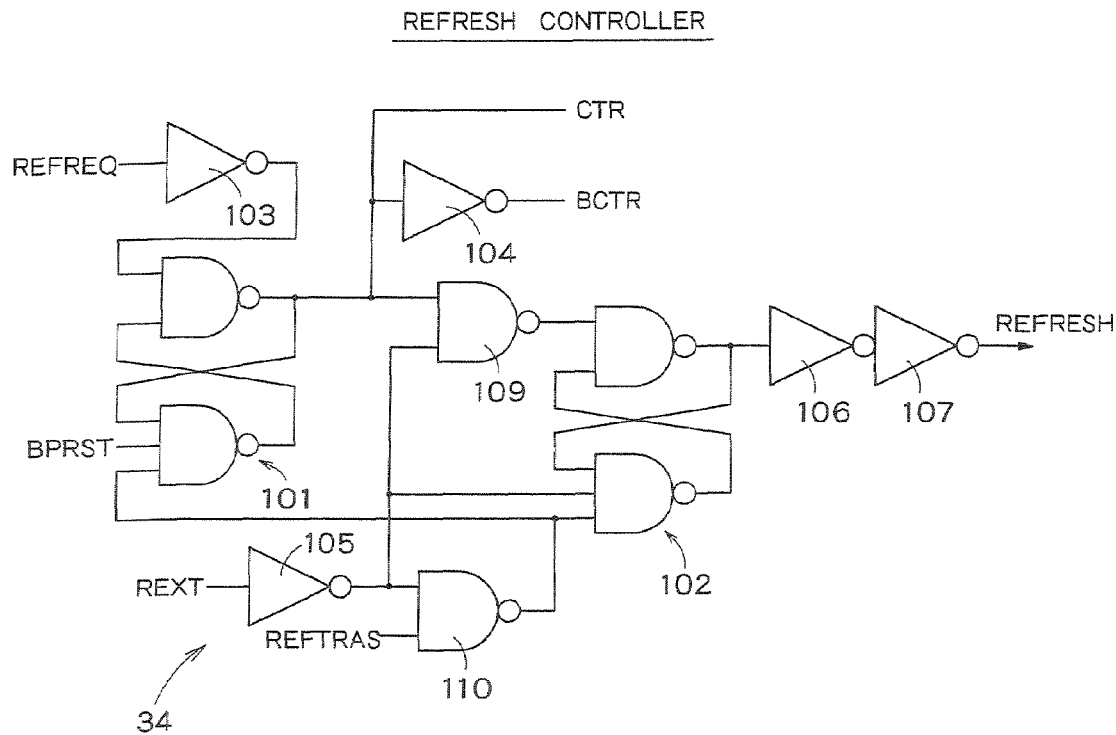
F I G. 9
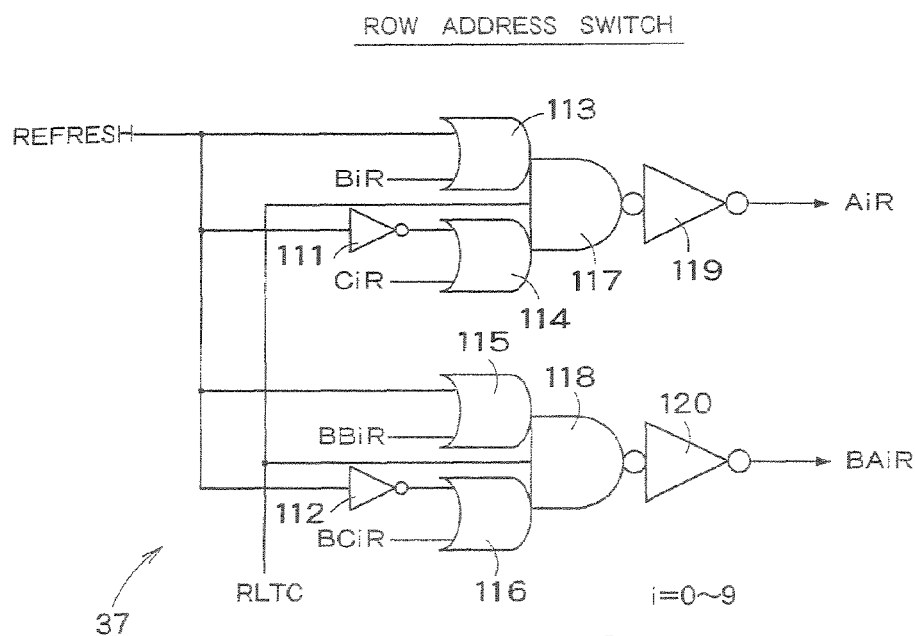
F I G. 10

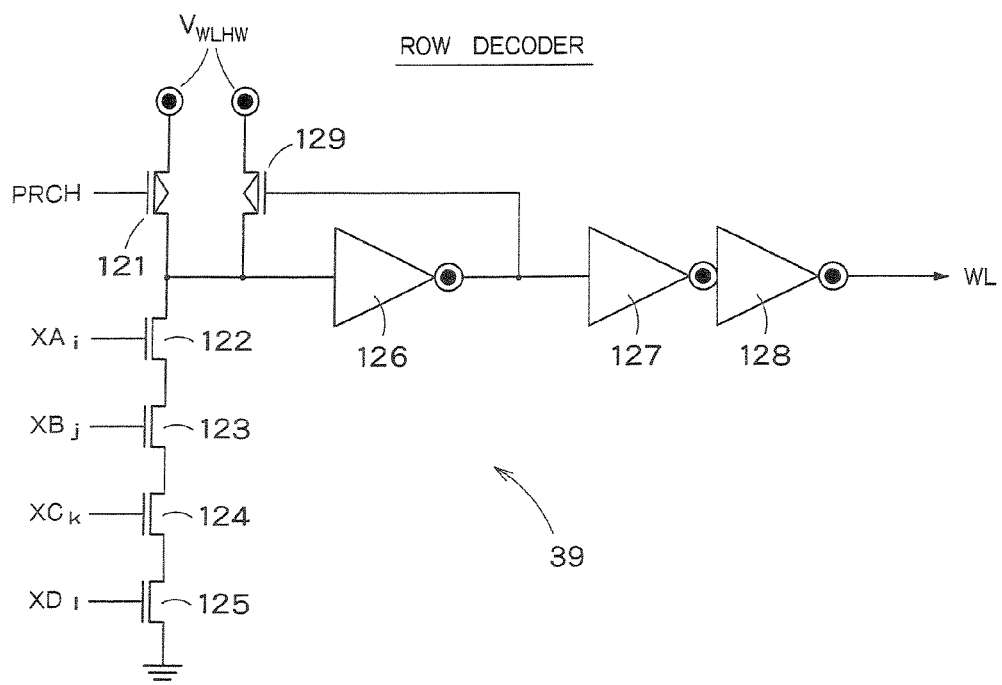
F I G. 11
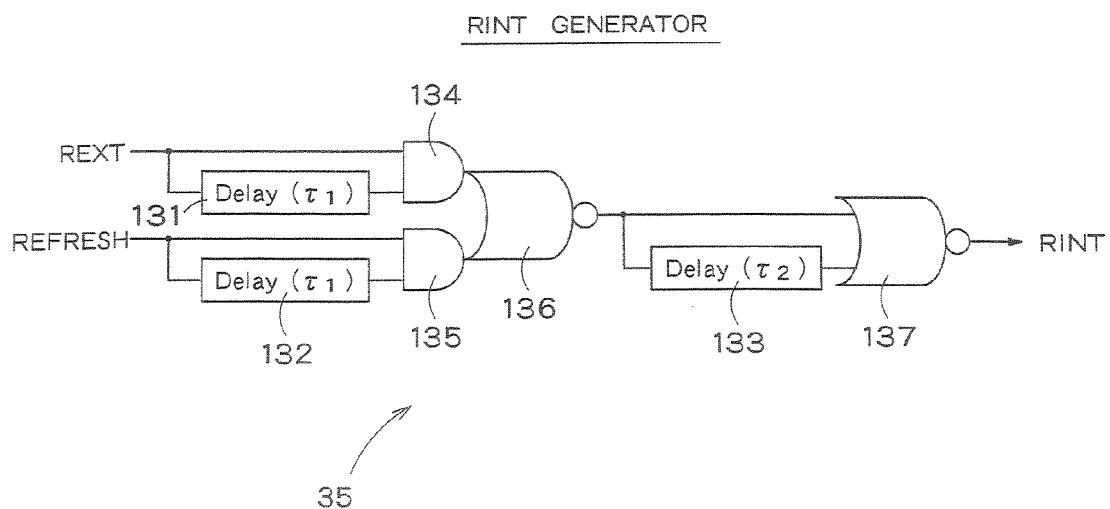
F I G. 12

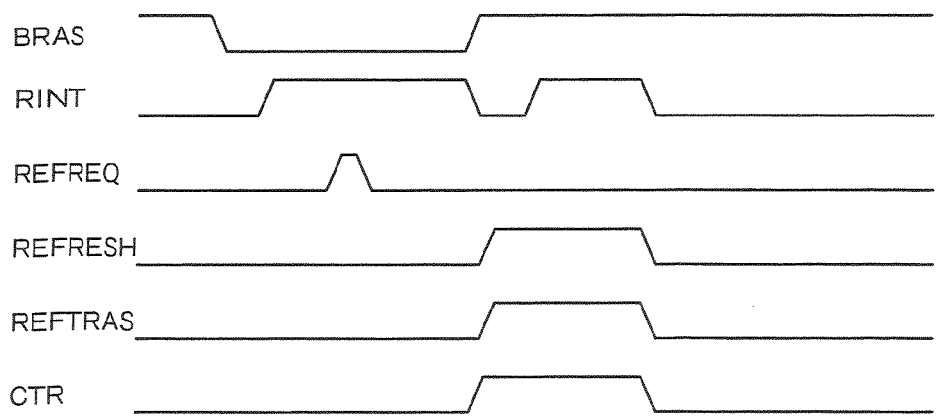
F I G. 13
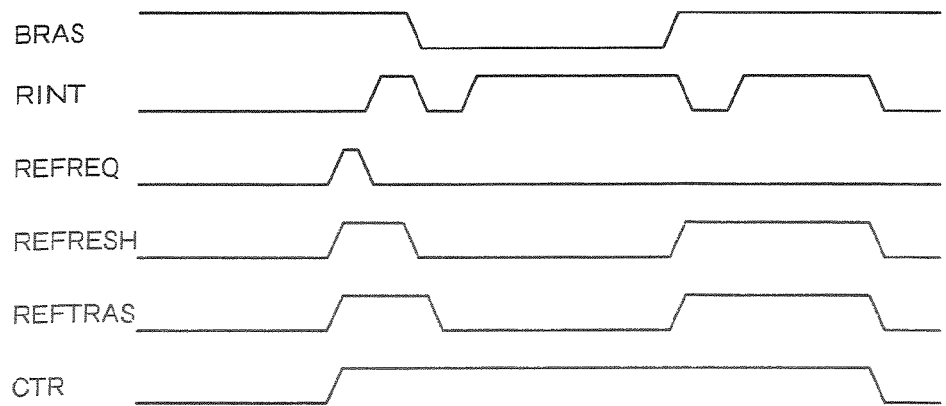
F I G. 14
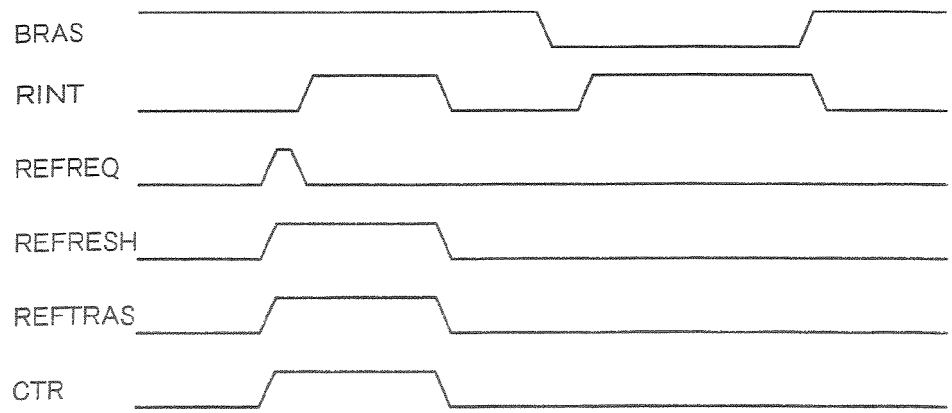
F I G. 15

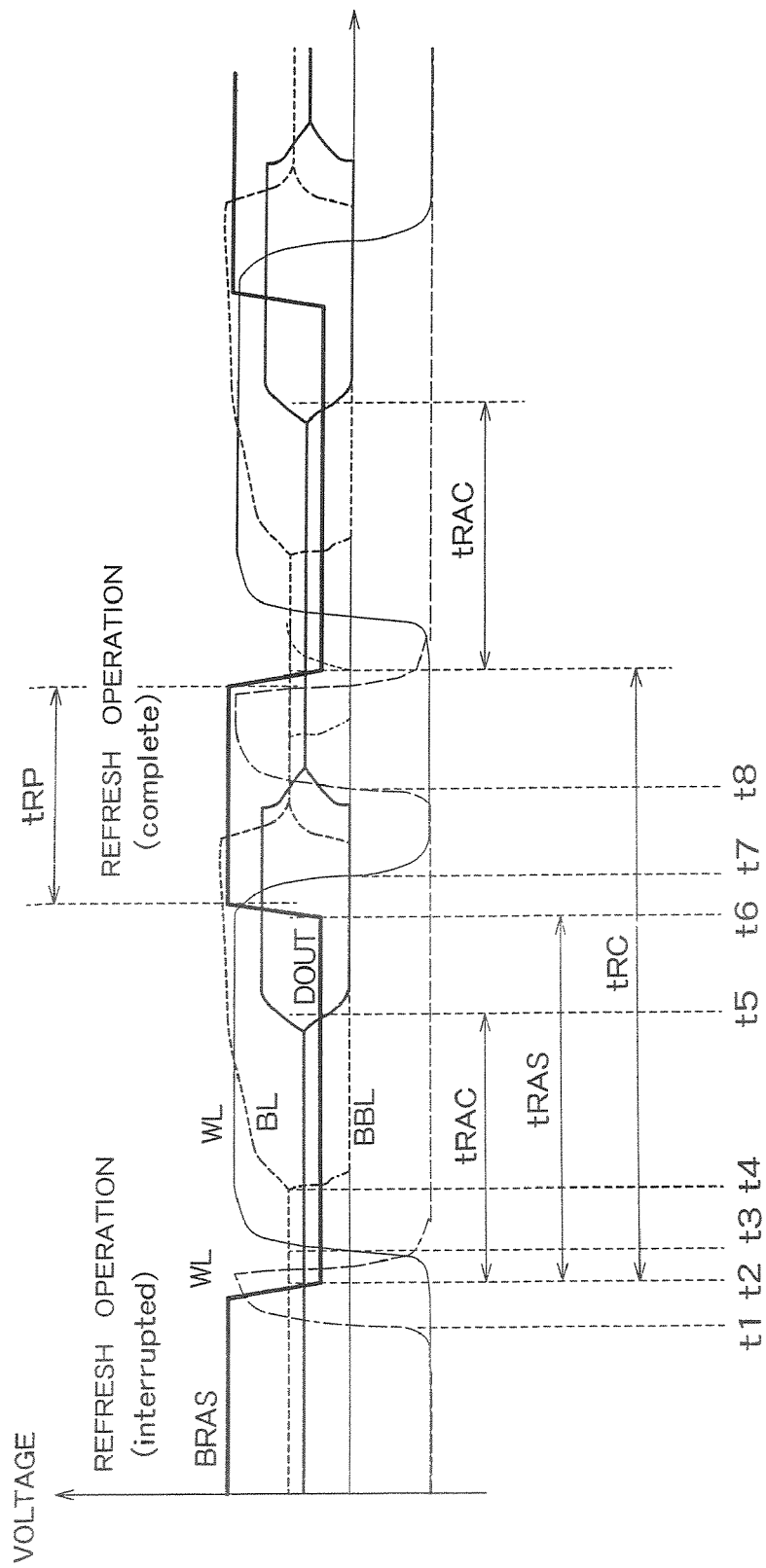
F I G. 16

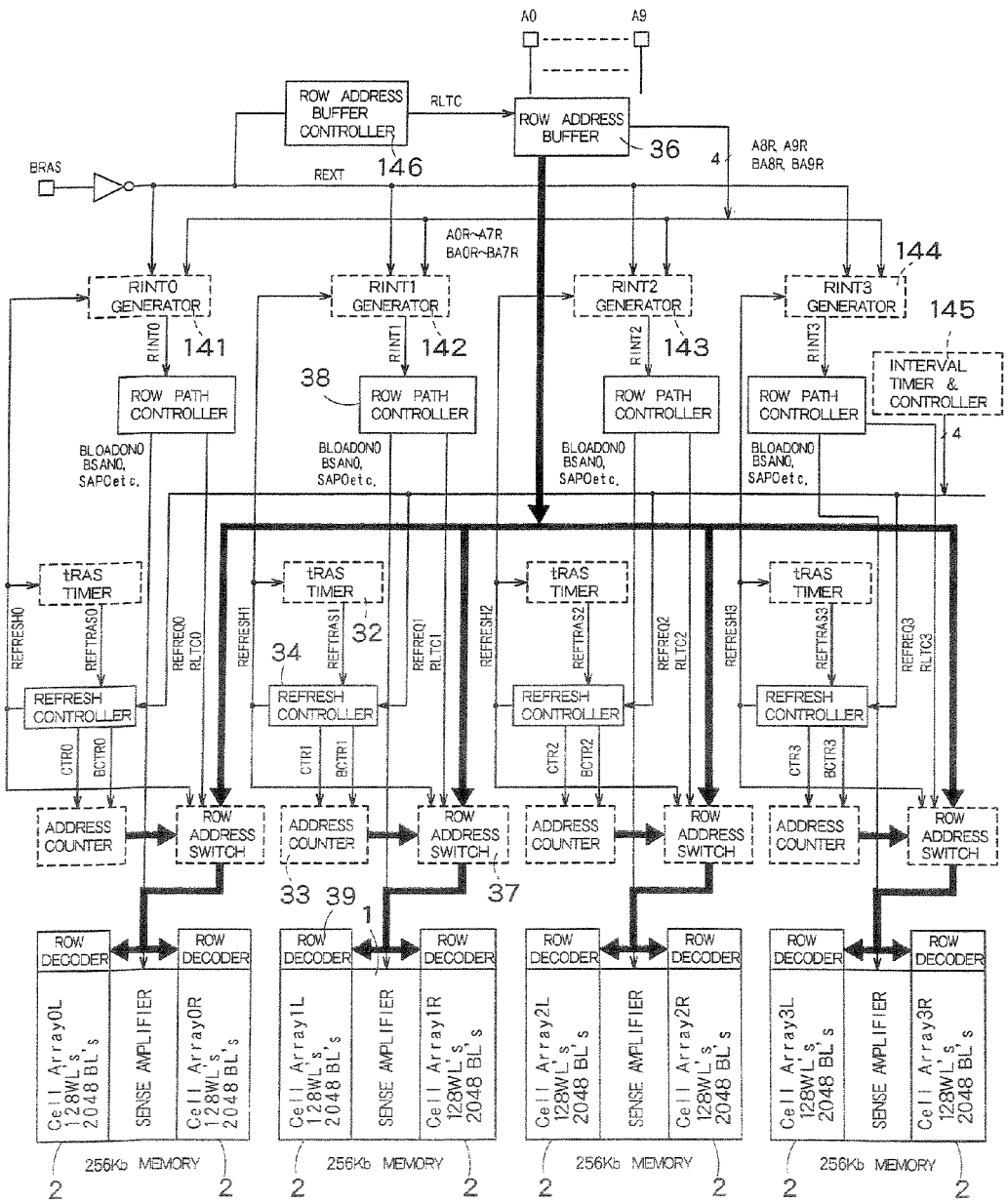
F I G. 17

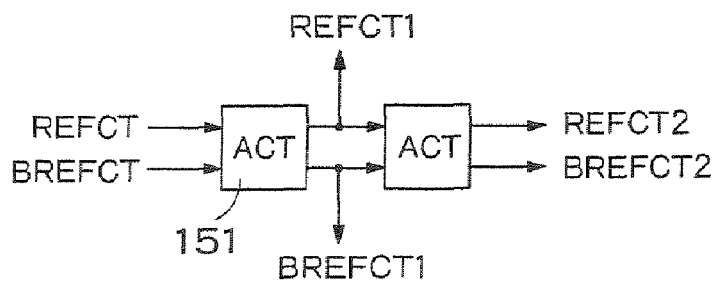
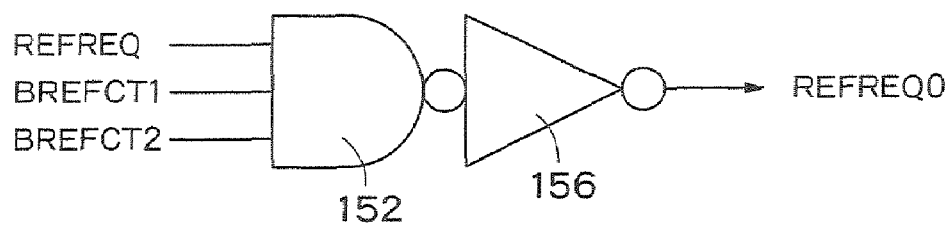
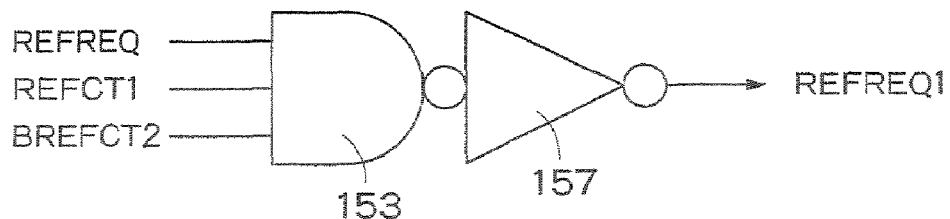
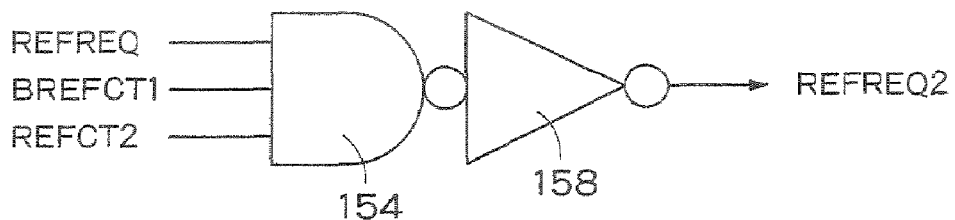
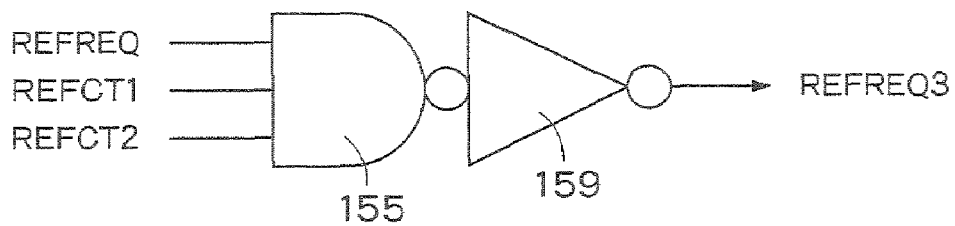
F I G. 18

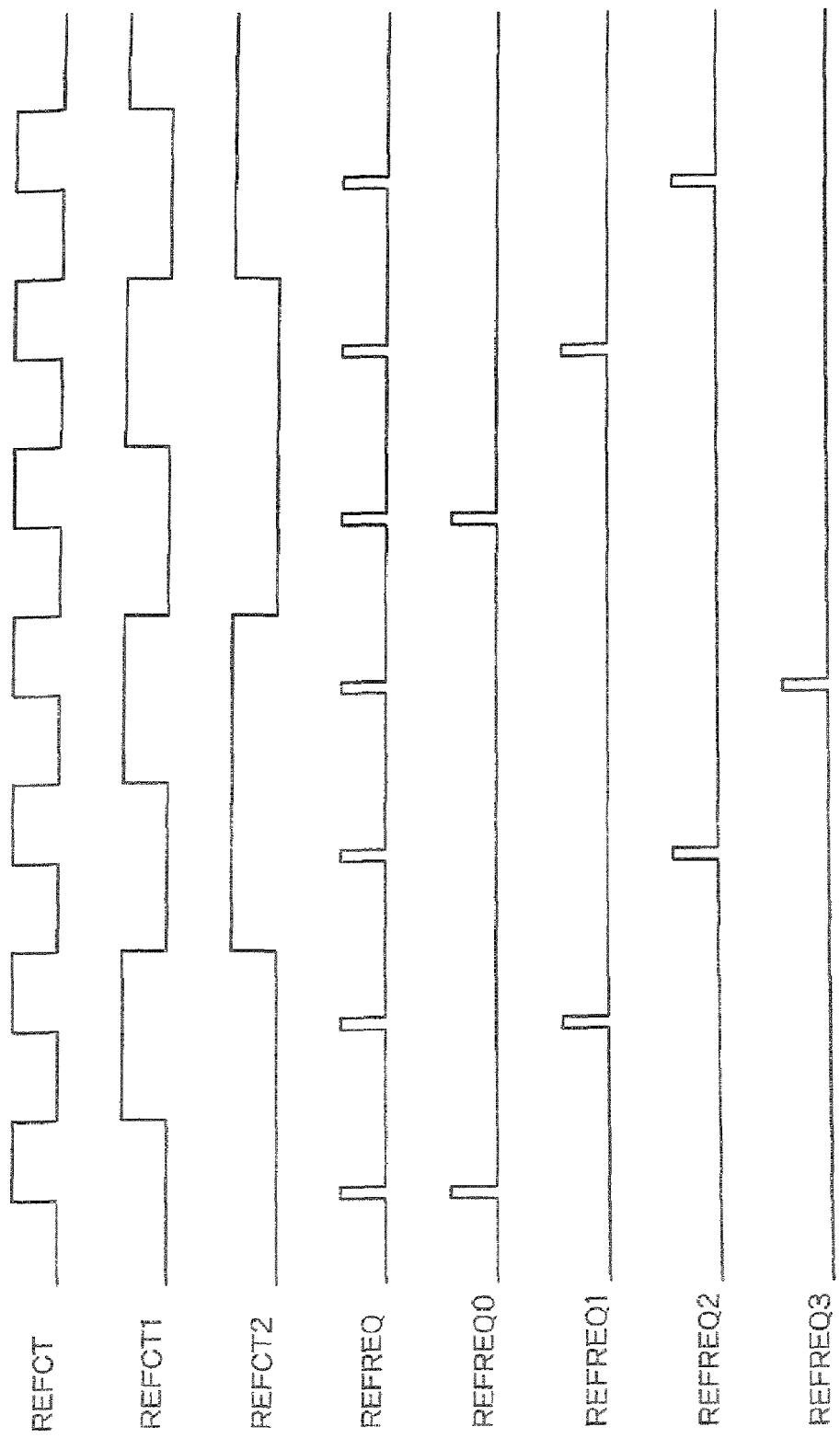

SEMICONDUCTOR STORAGE APPARATUS

CROSS REFERENCE TO RELATED APPLICATIONS

This application is a continuation of and claims the benefit of priority under 35 U.S.C. §120 from U.S. Ser. No. 11/092,904, filed on Mar. 30, 2005 now U.S. Pat. No. 7,251,179, and claims the benefit of priority under 35 U.S.C. §119 from Japanese Patent Application No. 2004-253070, filed on Aug. 31, 2004, the entire contents of each which are incorporated herein by reference.

BACKGROUND OF THE INVENTION

1. Field of the Invention

The present invention relates to a semiconductor storage apparatus including memory cells that need refresh operation.

2. Related Art

As for the conventional DRAM cell consisting of one transistor and one capacitor including a trench capacitor or a stacked capacitor, there is a concern that its fabrication may become difficult as it becomes finer. As a candidate for a future DRAM memory cell, a new memory cell FBC (Floating Body Cell) is proposed (see Japanese Patent Application Laid-Open Nos. 2003-68877 and 2002-246571). In the FBC, majority carriers are formed in a floating body of an FET (Field Effect Transistor) formed on SOI (Silicon on Insulator) or the like, to store information.

In the FBC, an element unit for storing one bit information is formed of only one MISFET (Metal Insulator Semiconductor Field Effect Transistor). Therefore, the occupation area of one cell is small, and storage elements having a large capacity can be formed in a limited silicon area. It is considered that the FBC can contribute to an increase of the storage capacity.

The principle of writing and reading for an FBC formed on PD-SOI (Partially Depleted-SOI) can be described as follows by taking an N-type MISFET as an example. A state of "1" is defined as a state in which there are a larger number of holes. On the contrary, a state in which the number of holes is smaller is defined as "0."

The MISFET includes an nFET formed on SOI. Its source is connected to GND (0 V) and its drain is connected to a bit line (BL), whereas its gate is connected to a word line (WL). Its body is electrically floating.

For writing "1" into the FBC, the transistor is operated in the saturation state. For example, the word line WL is biased to 1.5 V and the bit line BL is biased to 1.5 V. In such a state, a large number of electron-hole pairs are generated near the drain by impact ionization. Among them, electrons are absorbed to the drain terminal. However, holes are stored in the body having a low potential. The body voltage arrives at a balanced state in which a current generating holes by impact ionization balances a forward current of a p-n junction between the body and the source. The body voltage is approximately 0.7 V.

A method of writing data "0" will now be described. For writing "0," the bit line BL is lowered to a negative voltage. For example, the bit line BL is lowered to −1.5 V. As a result of this operation, a p-region in the body and an n-region connected to the bit line BL are greatly forward-biased. Therefore, most of the holes stored in the body are emitted into the n-region. A resultant state in which the number of holes has decreased is the "0" state. As for the data reading, distinguishing between "1" and "0" is conducted by setting the word line WL to, for example, 1.5 V and the bit line BL to a voltage as low as, for example, 0.2 V, operating the transistor in a linear region, and detecting a current difference by use of an effect (body effect) that a threshold voltage (Vth) of the transistor differs depending upon a difference in the number of holes stored in the body. The reason why the bit line voltage is set to a voltage as low as 0.2 V in this example at the time of reading is as follows: if the bit line voltage is made high and the transistor is biased to the saturation state, then there is a concern that data that should be read as "0" may be regarded as "1" because of impact ionization and "0" may not be detected correctly.

The FBC stores information relating to the difference of the number of majority carriers. While data is retained, the word line is set to a negative value with the source of the grounded cell. In both the "1" state and the "0" state, since the potential of the body is thus set to negative values by using capacitive coupling between the word line and the body, p-n junction between the body and the source and p-n junction between the body and the drain are reverse-biased. In this way, a current flowing between the body and the source and a current flowing between the body and drain are held down to low values.

Since there is a slight reverse bias current across each PN junction, however, holes flow into the body little by little. Since the gate is set to a negative potential as compared with the drain, there is also a flow of holes to the body caused by GIDL (Gate Induced Drain Leakage). Since the data "1" is the state in which the number of holes is originally large, therefore, it is sufficient to replenish holes which overflow when the body potential is raised to a positive value in ordinary read/write operation. As for data "0", however, refresh operation for bailing holes over a certain fixed period becomes necessary.

As compared with the conventional 1T (Transistor)-1C (Capacitor) type DRAM cell, the FBC is small in P-N junction area because the SOI substrate is used and the leak current can be held down to a comparatively small value. However, the capacitance for storing electric charge is less than 1 fF in the FBC whereas it is several tens fF in the conventional 1T-1C type DRAM cell. Therefore, it is inevitable that the data retaining time becomes shorter than that in the DRAM. Therefore, there is a drawback that the frequency of refreshing becomes high and the external access period for conducting the read/write operation is limited by that amount.

In a VSRAM (Virtually Static RAM) including conventional 1T-1C type cells, if read/write operation is conducted from the outside and a competition with the internal refresh operation occurs, the read/write operation must be kept waiting until the refresh operation is completed (see K. Sawada et al., "A 30-uA Data-Retention Pseudostatic RAM with Virtually Static RAM Mode", IEEE J. Solid-State Circuits, vol. 23). The reason is because the 1T-1C cell is a destructive read-out cell. In other words, once the WL is activated and data begins to be read out, cell data is destroyed if interruption occurs without amplifying the data and completing the rewrite operation. This results in a drawback that the random access time and the random write time are prolonged to twice or more if the VSRAM is composed by using the 1T-1C type DRAM.

SUMMARY OF THE INVENTION

A semiconductor storage apparatus according to one embodiment of the present invention, comprising:

memory cells which need refresh operation; and a refresh control circuit which suspends the refresh operation when external access for reading out from or writing into the memory cells is requested.

BRIEF DESCRIPTION OF THE DRAWINGS

FIG. 2 is a detailed circuit diagram showing an internal configuration of a sense amplifier 1 provided in the semiconductor apparatus of FIG. 1.

FIG. 5 is a circuit diagram showing an example of an internal configuration of the refresh interval timer 31.

FIG. 6 is a circuit diagram showing an example of an internal configuration of the tRAS timer 32.

FIG. 9 is a circuit diagram showing an example of an internal configuration of the refresh controller 34.

FIG. 10 is a circuit diagram showing an example of an internal configuration of the row address switch 37.

FIG. 11 is a circuit diagram showing an example of an internal configuration of the row decoder 39.

FIG. 12 is a circuit diagram showing an example of an internal configuration of the RINT generator 35.

FIG. 13 is an operation timing diagram in the case where a refresh request is given when the external signal BRAS is active.

FIG. 14 is an operation timing diagram in the case where the refresh request signal REFREQ is given when the external signal BRAS is at the high level (precharge state), but immediately thereafter the external signal BRAS becomes the low level.

FIG. 15 is an operation timing diagram in the case where the refresh request signal REFREQ is given when the external signal BRAS is at the high level (precharge state) and the precharge state is continued until the refresh operation is completed.

FIG. 16 is an operation timing diagram in the case where an interrupt is caused in the middle of the refresh operation by the ordinary read operation.

FIG. 17 is a block diagram showing a general configuration of a semiconductor storage apparatus according to the second embodiment.

FIG. 18 is a block diagram showing an example of an internal configuration of the interval timer & controller 145.

FIG. 19 is a timing diagram of signals generated by the interval timer & controller shown in FIG. 18.

DETAILED DESCRIPTION OF THE INVENTION

Hereafter, an embodiment of the present invention will be described with reference to the drawings.

First Embodiment

Figure 1:
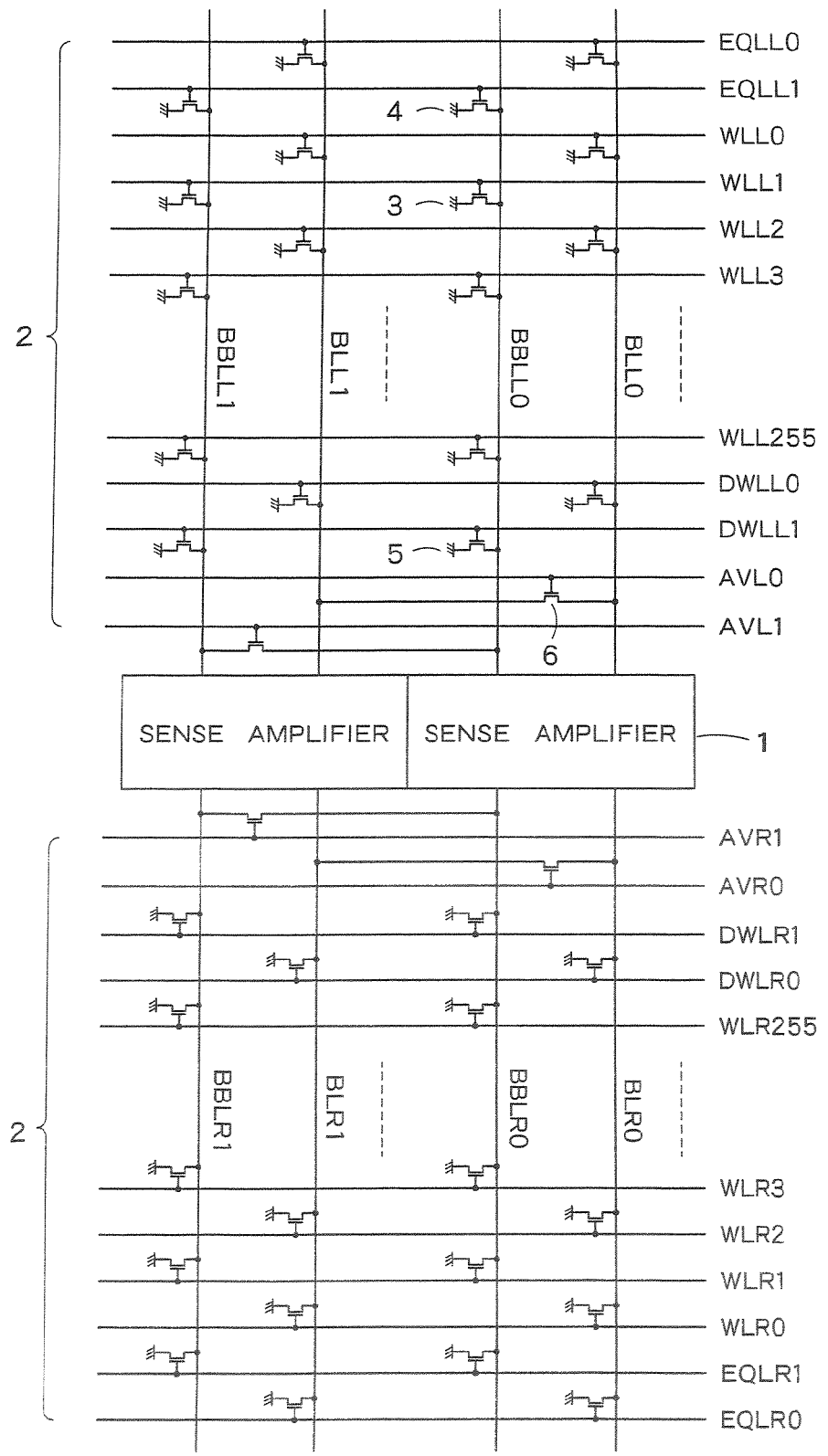
FIG. 1 is a circuit diagram showing an internal configuration of a semiconductor storage apparatus according to an embodiment of the present invention.
Figure 3:
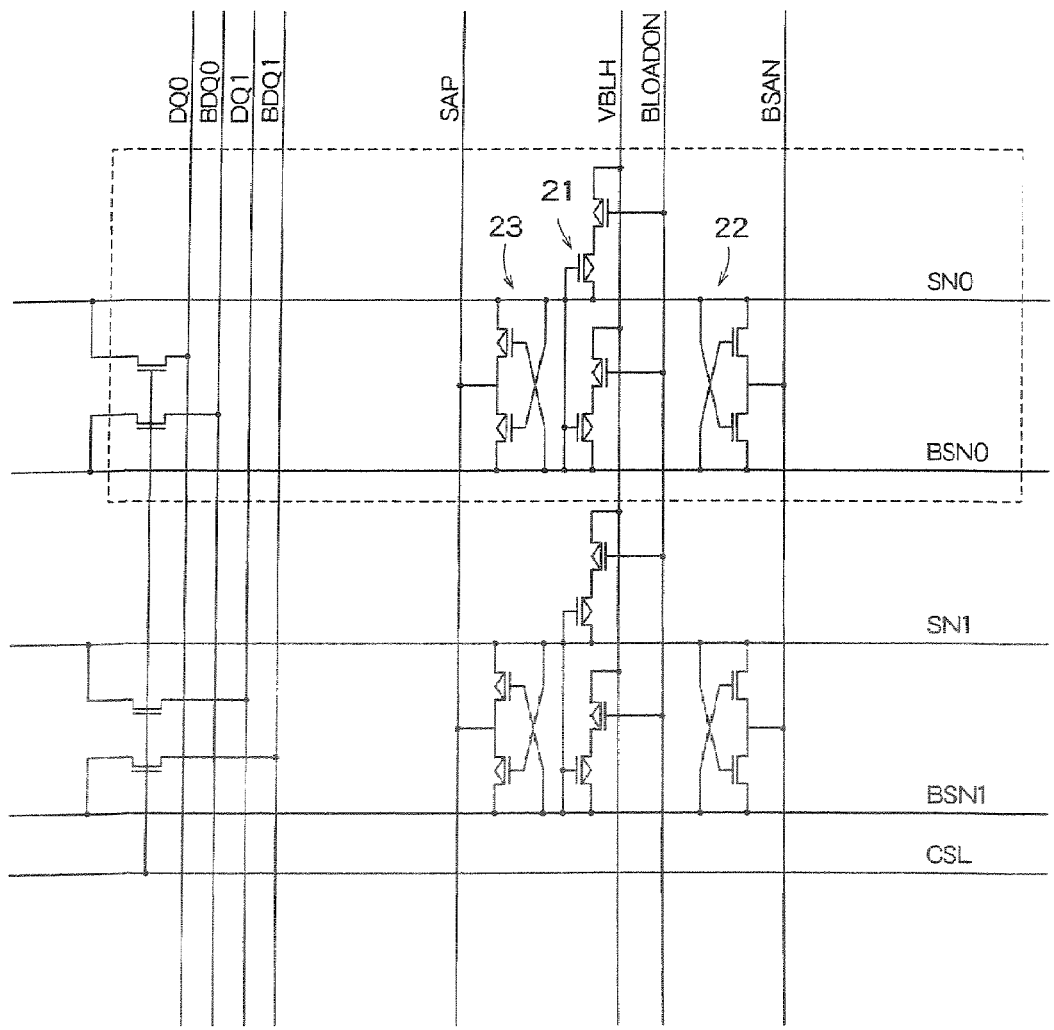
FIG. 3 is a detailed circuit diagram showing an internal configuration of a sense core unit 11.

FIG. 1 is a circuit diagram showing an internal configuration of a semiconductor storage apparatus according to an embodiment of the present invention. FIG. 2 is a detailed circuit diagram showing an internal configuration of the sense amplifier 1 provided in the semiconductor apparatus of FIG. 1. FIG. 3 is a detailed circuit diagram showing an internal configuration of the sense core unit 11, which is a core portion in the sense amplifier 1 shown in FIG. 2.

The semiconductor storage apparatus shown in FIG. 1 includes a plurality of sense amplifiers 1 arranged side by side approximately in the center, and cell arrays 2 arranged on both sides of the sense amplifiers 1. Although omitted in FIG. 1, the semiconductor storage apparatus according to the present embodiment includes a read/write control circuit.

As shown in FIG. 1, a cell array 2 includes 256 word lines arranged on the left or right side of the sense amplifiers 1. Although not illustrated, the cell array 2 includes 1024 pairs of bit lines. In other words, 1024 sense amplifiers 1 are arranged. FBCs 3 are disposed near intersections of even-numbered word lines and true lines of respective bit lines and intersections of odd-numbered word lines and complement lines of respective bit lines, respectively. In this way, the semiconductor storage apparatus shown in FIG. 1 has a cell arrangement of a folded bit line scheme.

Each of the cell arrays 2 arranged on the left and right sides of the sense amplifiers 1 includes bit line equalize transistors 4, each of which short-circuits a bit line to a source potential of the FBCs 3, and dummy cells 5. The bit line equalize transistors 4 are connected near intersections of equalize signal lines EQLL0, EQLL1, EQLR0 and EQLR1 and bit lines. Dummy cells 5 are connected near intersections of dummy word lines DWLL0, DWLL1, DWLR0 and DWLR1 and bit lines. Prior to read operation for FBCs 3, data "1" and "0" are written into the dummy cells 5 alternately in the word line direction by a circuit which will be described later.

NMOS transistors 6 are connected between one line included in a bit line pair and one line included in an adjacent bit line pair. Signals AVL0, AVR0, AVL1 and AVR1 are supplied to gates of the NMOS transistors 6.

As shown in FIG. 2, a transfer gate 15 formed of an NMOS transistor is connected between each bit line and a sense core 11. These transfer gates 15 are switched to turn on or off by φTL and φTR. Hereafter, paths located on the sense amplifiers 1 side with respect to the transfer gates 15 are referred to as sense nodes SN0, BSN0, SN1 and BSN1.

Each CMOS transfer gate 12 switches to cross-connect sense nodes to bit lines. NMOS transistors in the transfer gates 12 are controlled by signals FBL0, FBL1, FBR0 and FBR1, whereas PMOS transistors in the transfer gates 12 are controlled by signals BFBL0, BFBL1, BFBR0 and BFBR1.

A transistor 13 is connected to each of bit lines BLL0, BBLL0, BLR0 and BBLR0 to couple the bit line to the ground potential VBLL. "0" is written into dummy cells 5 connected to the bit lines BLL0, BBLL0, BLR0 and BBLR0 by the transistors 13. A transistor 14 is connected to each of adjacent bit lines BLL1, BBLL1, BLR1 and BBLR1 to couple the bit line to a power supply voltage VBLH. "1" is written into dummy cells 5 connected to the bit lines BLL1, BBLL1, BLR1 and BBLR1 by the transistors 14.

For example, it is now supposed that WLL0 in the cell array 2 located on the left side of the sense amplifiers 1 is activated. In this case, the dummy bit line DWLL1 and the signal AVL1 are also activated at the same time. As a result, FBCs 3 are coupled to the bit lines BLL0 and BLL1. At the same time, dummy cells 5 having "0" written therein are coupled to a bit line BBLL0, and dummy cells 5 having "1" written therein are coupled to a bit line BBLL1. And the transistor 6 turns on, and the bit lines BBLL0 and BBLL1 are short-circuited to each other. Therefore, currents flowing through the two dummy cells are averaged. It is equivalent to that an intermediate current between "1" and "0" cell currents flows through the bit lines BBLL0 and BBLL1. In the case of a "0" cell, therefore, potentials on the sense nodes SN0 and SN1 become higher than those on the sense nodes BSN0 and BSN1. In the case of a "1" cell, potentials on the sense nodes SN0 and SN1 become lower than those on the sense nodes BSN0 and BSN1. When these potential differences have been sufficiently developed, a signal BSAN becomes a low level and a signal SAP becomes a high level.

As shown in FIG. 3, the sense core unit 11 includes a current load circuit 21 formed of a current mirror circuit, and dynamic latch circuits 22 and 23 connected to the pair of bit lines SN0 and BSN0. The signal BSAN is input to a connection node between two NMOS transistors forming the dynamic latch circuit 22. The signal SAP is input to a connection node between two PMOS transistors forming the dynamic latch circuit 23. When the potential difference between the pair of sense nodes SN0 and BSN0 or SN1 and BSN1 has been sufficiently developed, the dynamic latch circuits 22 and 23 conduct latch operation.

It has been found that the FBC 3 is not a complete non-destructive read-out cell. The reason is because the charge pumping phenomenon is present. If the on-off operation of a transistor is repeated, i.e., the so-called pumping operation at the gate is conducted a plurality of times, the inversion state and the accumulation state on the gate silicon surface are repeated alternately and holes gradually disappear at an interface between the silicon surface and $SiO_2$. This is the charge pumping phenomenon.

The number of holes that disappear due to one state change between inversion and accumulation depends on a density Nit of interface levels at the Si—$SiO_2$ interface. For example, supposing that Nit=$1\times10^{10}$ cm$^{-2}$ and W (channel width)/L (channel length) of a cell transistor=0.1 μm/0.1 μm, the area of the Si—$SiO_2$ interface becomes $1.0\times10^{-10}$ cm$^2$ per cell and consequently the number of interface levels per cell becomes approximately one on the average. The number of holes stored in one FBC 3 has a difference of approximately 1,000 when the data is "1" or "0". If the word line WL is subjected to pumping approximately 1,000 times, therefore, data "1" completely changes to data "0".

Practically, if the word line WL is subjected to pumping approximately 500 times, then the readout margin for the data "1" is lost and the risk that a fail may occur becomes high. Therefore, the FBC 3 is neither a destructive read-out cell nor a complete non-destructive read-out cell. The FBC 3 is so to speak a "quasi non-destructive read-out cell".

However, data in the FBC 3 is not destroyed by only one read operation. Therefore, it is allowed for an external read or write operation to interrupt the refresh operation. This means that the external access can have priority over the internal refresh operation in the VSRAM (when competing with the refresh operation). Thus, it becomes possible to design the VSRAM whose performance is equivalent to the access time and write time of the FBC 3 memory in which self-refresh operation is not conducted.

Figure 4:
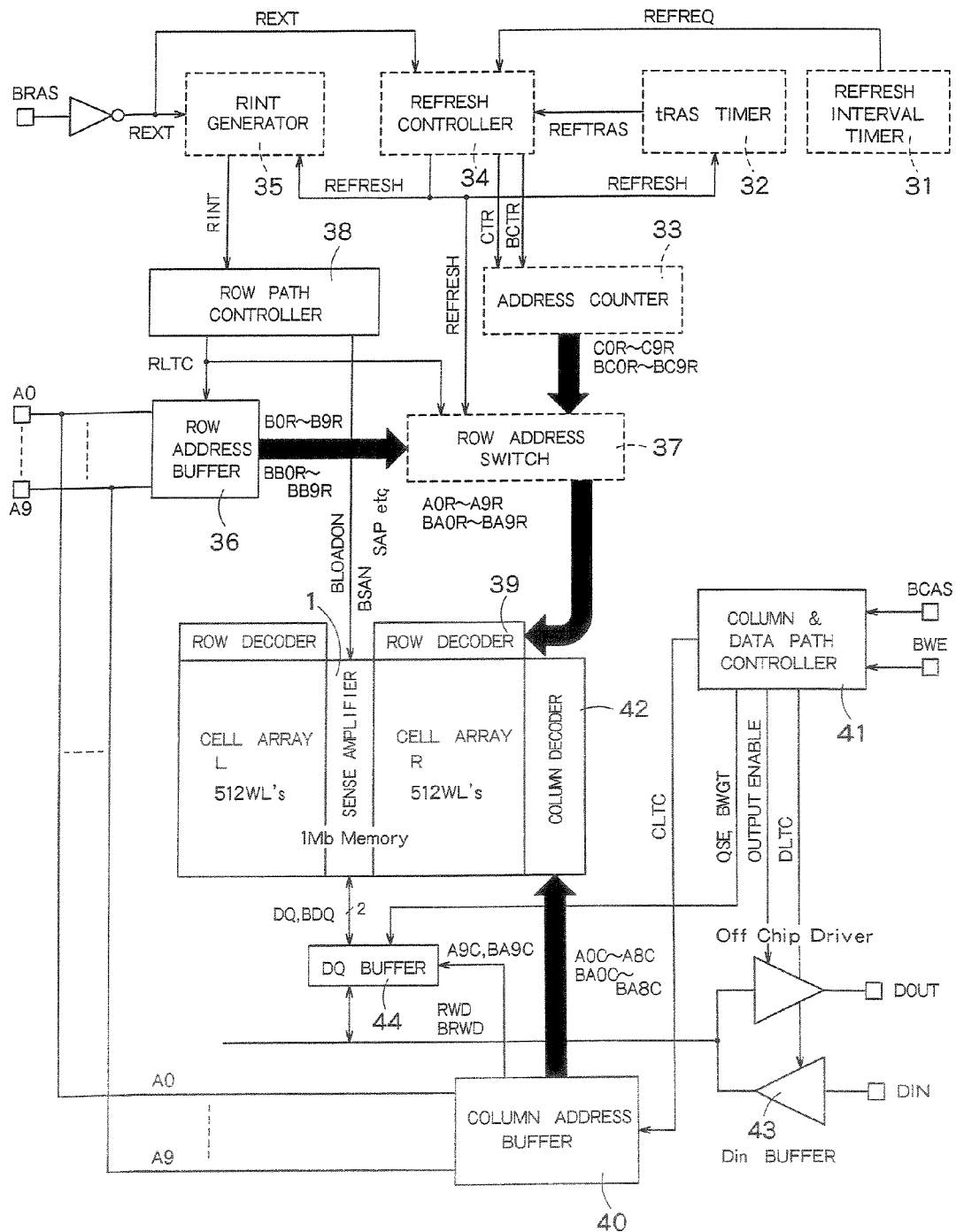
FIG. 4 is a block diagram showing a general configuration of a semiconductor storage apparatus according to the present embodiment.

FIG. 4 is a block diagram showing a general configuration of a semiconductor storage apparatus according to the present embodiment. The semiconductor storage apparatus shown in FIG. 4 includes a refresh interval timer 31 to conduct time measurement in order to prescribe an interval period between a refresh operation of the FBC 3 and the next refresh operation, a tRAS timer 32 to conduct time measurement in order to prescribe a tRAS period required for the refresh operation, an address counter 33 to generate an address of an FBC 3 to be refreshed, a fresh controller 34 to control the refresh operation and the external access operation, a RINT generator 35 to generate a control signal RINT described later, a row address buffer 36, a row address switch 37, a row path controller 38 to control the row address, a row decoder 39, a column address buffer 40, a column & data path controller 41, a column decoder 42, a data input-output buffer 43, and a DQ buffer 44.

FIG. 5 is a circuit diagram showing an example of an internal configuration of the refresh interval timer 31. The timer shown in FIG. 5 includes a bias circuit 51, a ring oscillator 52, and an output circuit 53. The bias circuit 51 includes a PMOS transistor 54 having a current mirror connection in which its gate is short-circuited to its drain, an NMOS transistor 55 having a current mirror connection in which its gate is short-circuited to its drain in the same way, and a resistor 56 connected between the drain of the PMOS transistor 54 and the drain of the NMOS transistor 55.

The ring oscillator 52 includes five-stage logic inversion circuits 57 connected in series. The output of a logic inversion circuit 57 located at the final stage is fed back to the input of a logic inversion circuit 57 located at the first stage. Each of the logic inversion circuits includes a PMOS transistor 58, a PMOS transistor 59, an NMOS transistor 60 and an NMOS transistor 61 connected in series between a power supply voltage and a ground voltage.

The PMOS transistor 54 in the bias circuit 51 constitutes a current mirror circuit in conjunction with the PMOS transistor 58 and PMOS transistors 62 to 65 in the ring oscillator 52. The NMOS transistor 55 in the bias circuit 51 constitutes a current mirror circuit in conjunction with the NMOS transistor 61 and NMOS transistors 66 to 69 in the ring oscillator 52. Therefore, a current that is equal in magnitude to that flowing through the bias circuit 51 flows through the PMOS transistors 58 and 62 to 65 and the NMOS transistors 61 and 66 to 69 in the ring oscillator 52.

The output circuit 53 includes an inverter 70 to invert the output RFECT of the ring oscillator 52, inverters 71 to 75 of five stages connected in series, and a NOR circuit 76 to conduct a NOR operation on an output of the inverter 75 disposed at the final stage and the output of the inverter 70.

The NOR circuit 76 conducts the NOR operation on the signal BREFCT obtained by inverting the input-output signal REFCT of the ring oscillator 52 and the signal obtained by inverting the signal BREFCT by means of the inverters 71 to 75.

The refresh interval timer 31 flows a current equal to that flowing through the bias circuit 51, through stages of the ring oscillator 52. Therefore, high precision time measurement that does not depend upon dispersion of device characteristics of MOSFETs can be conducted. A signal REFREQ output from this timer 31 is a positive pulse having the measured time as its period.

FIG. 6 is a circuit diagram showing an example of an internal configuration of the tRAS timer 32. The tRAS timer 32 shown in FIG. 6 includes an inverter 81, a delay circuit 82, and an inverter 83 connected in series. The tRAS timer 32 outputs a signal REFTRAS obtained by delaying a signal REFRESH, which instructs the refresh operation, by time τ3. A time period since the signal REFRESH becomes a high level until the signal REFTRAS becomes a high level can be considered to be a time period over which a signal BRAS, which is typically an external signal, is active (at a low level), i.e., a time period over which the refresh operation is being conducted. In other words, the tRAS timer 32 measures time τ3 required for the refresh operation.

Figure 7:
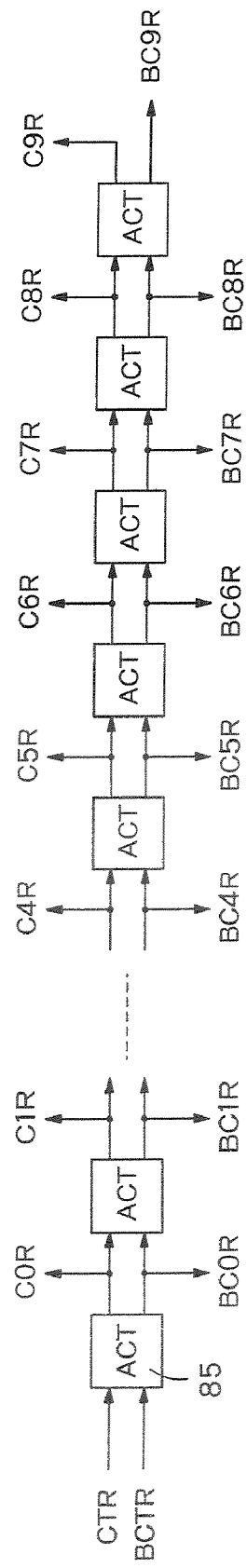
FIG. 7 is a block diagram showing an example of an internal configuration of the address counter 33.

FIG. 7 is a block diagram showing an example of an internal configuration of the address counter 33. As shown in FIG. 7, the address counter 33 includes a plurality of frequency divider circuits 85 connected in series. An output logic of each frequency divider circuit 85 changes at a falling edge of its input signal. Each frequency divider circuit 85 outputs a divided frequency signal, which is obtained by dividing its input signal by two in frequency.

Figure 8:
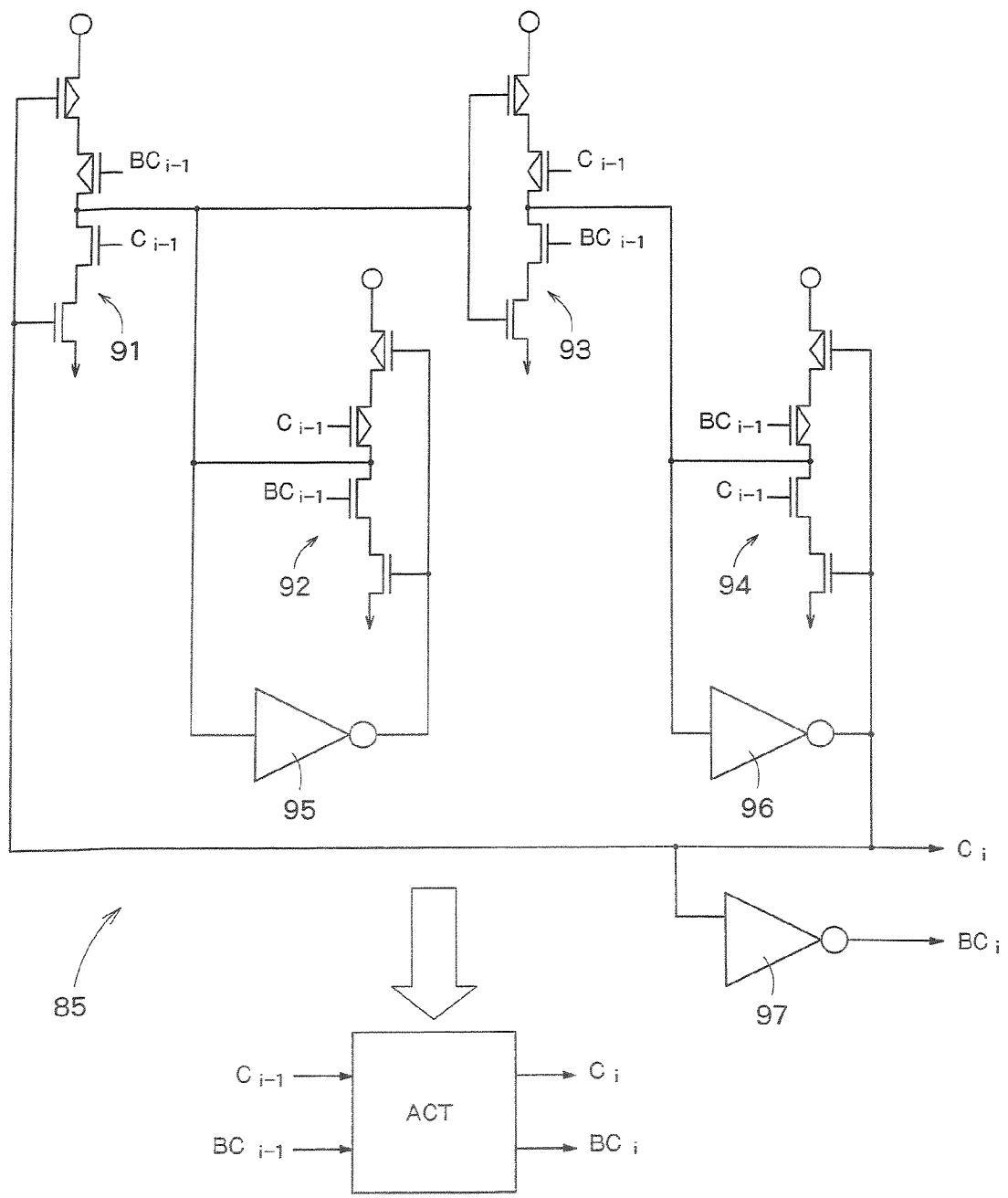
FIG. 8 is a circuit diagram showing an example of an internal configuration of a frequency divider circuit 85.

FIG. 8 is a circuit diagram showing an example of an internal configuration of the frequency divider circuit 85. As shown in FIG. 8, the frequency divider 85 includes a logic inversion circuit 91 having an output logic switched by a logic in which a signal BCi-1 is at a low level and a signal Ci-1 is at a high level, a logic inversion circuit 92 having an output logic switched by a logic in which the signal Ci-1 is at a low level and the signal BCi-1 is at a high level, a logic inversion circuit 93 having an output logic switched by a logic in which the signal Ci-1 is at a low level and the signal BCi-1 is at a high level, a logic inversion circuit 94 having an output logic switched by a logic in which a signal BCi-1 is at a low level and a signal Ci-1 is at a high level, and inverters 95 to 97. Each of the logic inversion circuits includes a PMOS transistor, a PMOS transistor, an NMOS transistor and an NMOS transistor connected between a power supply terminal and a ground terminal.

FIG. 9 is a circuit diagram showing an example of an internal configuration of the refresh controller 34. The refresh controller 34 shown in FIG. 9 includes flip-flops 101 and 102 each including two cross-connected NAND circuits, inverters 103 to 107, and NAND circuits 109 and 110.

FIG. 10 is a circuit diagram showing an example of an internal configuration of the row address switch 37. The row address switch 37 includes inverters 111 and 112, OR circuits 113 to 116, NAND circuits 117 and 118, and inverters 119 and 120.

FIG. 11 is a circuit diagram showing an example of an internal configuration of the row decoder 39. The row decoder 39 includes a PMOS transistor 121 and four NMOS transistors 122 to 125 connected in series between a voltage VWLHW which is provided on the word line when writing data into a memory cell and a voltage VWLL which is provided on the word line when retaining data, three inverters 126 to 128 connected in series to the connection node between the PMOS transistor 121 and the NMOS transistor 122, and a PMOS transistor 129 connected between the connection node and the voltage VWLHW.

Supposing that the refresh request signal REFREQ formed of a positive pulse is output when the external signal BRAS is at a high level (a precharge state of the FBC 3), the inverted signal REXT for the signal BRAS is at a low level and consequently the refresh signal REFRESH output from the refresh controller 34 shown in FIG. 9 becomes a high level. As a result, a refresh operation is started.

If time $\tau 3$ elapses since the refresh signal becomes the high level, then the output signal REFTRAS of the tRAS timer 32 shown in FIG. 6 becomes the high level, and the flip-flop 102 in a latter stage in the refresh controller shown in FIG. 9 is reset. As a result, the refresh signal REFRESH falls to a low level and the refresh operation is completed.

If the external signal BRAS falls to a low level before elapse of the time $\tau 3$, i.e., (if an interrupt is caused during the refresh operation by the ordinary read/write operation), then the inverted signal REXT for the external signal BRAS becomes a high level. As a result, the flip-flop 102 in the latter stage in the refresh controller 34 shown in FIG. 9 is reset, and the refresh signal REFRESH becomes the low level. In other words, if an interrupt is conducted in the middle of the refresh operation by ordinary operation, then the refresh operation is forcibly suspended. And the output of the NAND circuit 110 is forcibly set to a high level by the inverted signal of the signal REXT in order to prevent the output of the flip-flop 101 in the former stage in the refresh controller 34 from being reset even if the delay time of $\tau 3$ elapses and the output signal REFTRAS of the tRAS timer 32 shown in FIG. 6 becomes the high level.

If thereafter the ordinary read/write operation is finished and the external signal BRAS becomes the high level again, then its inverted signal REXT becomes the low level. At this time, the output signal REFTRAS of the tRAS timer 32 shown in FIG. 6 is at a low level. Therefore, the flip-flop 102 in the latter stage in the refresh controller 34 shown in FIG. 9 is set again, and the refresh signal REFRESH rises. As a result, the refresh operation which has been suspended is resumed.

At this time, the word line for the refresh operation is selected by inputting an output of the address counter 33 shown in FIG. 7 to the row decoder 39 shown in FIG. 11 via the row address switch 37 shown in FIG. 10.

The address counter 33 shown in FIG. 7 conducts count operation in response to signals CTR and BCTR output from the flip-flop 101 in the former stage in the refresh controller 34 shown in FIG. 9. Even if an interrupt is conducted during the refresh operation by the ordinary read/write operation, however, the flip-flop 101 in the former stage is not reset, and consequently the logics of the signals CTR and BCTR do not change and the address counter 33 does not count up.

If the refresh operation is suspended by an interrupt and then the refresh operation is resumed, therefore, then the selected word line is the same as the word line before the interrupt and the refresh operation can be conducted correctly from the suspended address.

If the refresh operation is completed normally without an interrupt conducted by the ordinary read/write operation, both the flip-flops in the former and latter stages in the refresh controller 34 shown in FIG. 9 are reset. As a result, logics of the signals CTR and BCTR change, and the address counter 33 shown in FIG. 7 counts up. At the time of the next refresh operation, the apparatus is ready for refreshing a new word line.

The signal BPRST input to the flip-flop 101 in the former stage is a signal that maintains the low level immediately after power is turned on in order to prevent the output from becoming vague when both two inputs of the flip-flop 101 are at the high level, and that rises to the high level after the output of the flip-flop 101 has become a required value.

FIG. 12 is a circuit diagram showing an example of an internal configuration of the RINT generator 35. The RINT generator 35 includes delay circuits 131 to 133, AND circuits 134 and 135, and NOR circuits 136 and 137. The signal RINT is generated by using the inverted signal REXT for the external signal BRAS and the refresh signal REFRESH.

The signal REXT becomes the high level, and then the signal RINT rises after a delay time of $\tau 1+\tau 2$. Hereafter, the reason why the time $\tau 1+\tau 2$ is necessary will be described. It is now supposed that the refresh operation is started and a word line is activated and then an interrupt is conducted by the ordinary read/write operation (hereafter referred to as ordinary operation). At this time, the activated word line is deactivated, and a word line corresponding to the ordinary operation is activated to conduct the ordinary operation. When activating the word line for the refresh operation again after completion of the ordinary operation, it is necessary to switch the row decoder 39 properly.

Typically, as shown in FIG. 11, the row decoder 39 includes dynamic NAND circuits. The following processing orders are important, i.e. all addresses are set to the low level, then a signal PRCH is set to a low level, then the decoder circuit is precharged properly, then the next address is inputted, and the word line is activated.

Even if the signals REXT (low to high) and REFRESH (high to low) are almost simultaneously switched in the RINT generator 35 shown in FIG. 12, therefore, a signal that changes from the high level to the low level is immediately propagated and the signal RINT becomes the low level. Thereafter, the signal RINT is raised to the high level after a wait of time (τ1+τ2), where τ1 is time taken until the row address is reset or time taken until the signal PRCH becomes the low level, and τ2 is time taken until the row decoder 39 is precharged properly or time of a pulse width required for the signal PRCH. Such an operation is implemented by the circuit configuration shown in FIG. 12.

As timing of the competition between the ordinary read/write operation and the refresh operation, three cases shown in FIGS. 13 to 15 are conceivable.

FIG. 13 is an operation timing diagram in the case where a refresh request is given when the external signal BRAS is active. Even if the refresh request signal REFREQ is given when the inverted signal REXT for the external signal BRAS is at the high level, the flip-flop 102 in the latter stage in the refresh controller 34 is not set. Therefore, the refresh signal REFRESH remains at the low level.

Since the flip-flop 101 in the former stage is set, the flip-flop 102 in the latter stage is set and the refresh signal REFRESH becomes the high level when the signal REXT has become the low level (when the external signal BRAS is not active). If the time tRAS τ3 required for the refresh elapses thereafter, the refresh operation is completed.

FIG. 14 is an operation timing diagram in the case where the refresh request signal REFREQ is given when the external signal BRAS is at the high level (precharge state), but immediately thereafter the external signal BRAS becomes the low level (active state). Since in this case the refresh request signal REFREQ is given while the inverted signal REXT for the external signal BRAS is at the low level, the refresh signal REFRESH immediately becomes the high level. Since the external signal BRAS becomes active before the tRAS time τ3 required for the refresh operation elapses, however, the flip-flop 102 in the latter stage in the refresh controller 34 shown in FIG. 9 is reset and the refresh signal REFRESH falls to the low level.

If the external signal BRAS is brought into the precharge state and the signal REXT becomes the low level thereafter, then the flip-flop 102 in the latter stage in the refresh controller 34 shown in FIG. 9 is set again and the refresh signal REFRESH rises. After the tRAS time τ3 required for the refresh operation has elapsed, the refresh operation is completed.

Until the refresh operation is resumed since the refresh operation is suspended, the flip-flop 101 in the former stage in the refresh controller 34 shown in FIG. 9 continues to be set. Therefore, the signal CTR, which causes the address counter 33 shown in FIG. 7 to count up, is kept at the high level. Therefore, the word line selected when the refresh operation is suspended is the same as the word line selected when the refresh operation is resumed. Even if the refresh operation is suspended once, the refresh operation can be conducted properly from the address at the time when the refresh operation is suspended.

FIG. 15 is an operation timing diagram in the case where the refresh request signal REFREQ is given when the external signal BRAS is at the high level (precharge state) and the precharge state is continued until the refresh operation is completed.

If the request signal REFREQ is output while the inverted signal REXT for the external signal BRAS is at the low level, then the refresh signal REFRESH becomes the high level. Since the external signal BRAS does not become active within the tRAS time τ3 required for the refresh operation, the refresh operation is completed normally. After the external signal BRAS becomes active thereafter and the ordinary read/write operation is completed, the refresh operation is not started unlike the case shown in FIG. 14.

FIG. 16 is an operation timing diagram in the case where an interrupt is caused in the middle of the refresh operation by the ordinary read operation. A word line for the refresh operation is activated at time t1, and the external signal BRAS becomes the low level (active state) at time t2. As a result, the word line is immediately deactivated, and a world line for the ordinary read is activated at time t3. A potential difference between the bit lines BL and BBL becomes gradually large at time t4. At time t5, the potential difference on a data line DOUT also becomes large gradually and data readout is conducted.

After the read operation is finished, the external signal BRAS is raised to the high level (precharge state) at time t6. As a result, a word line for the ordinary readout is activated at time t7. Thereafter, the word line for the suspended refresh operation is activated again at time t8.

Thus, if the ordinary read/write request is given in the middle of the refresh operation in the first embodiment, the refresh operation is suspended to conduct the ordinary read/write operation and the refresh operation is resumed after the ordinary read/write operation is finished. Therefore, there is no concern that the external access speed may be limited by the refresh operation, and fast operation is made possible.

By the way, the first embodiment does not cope with the case where before the refresh operation started in response to a given refresh request REFREQ is not yet completed the next refresh request REFREQ is given. Therefore, the time over which the external signal BRAS is active continuously is limited to (refresh interval tREF+2×tRAS (ref)) or less. Here, the refresh interval tREF is an interval prescribed by the refresh interval timer 31 shown in FIG. 5, and it is time between start of a refresh operation and the next start of a refresh operation. The time tRAS (ref) is time interval τ3 taken for the refresh operation prescribed by the tRAS timer 32 shown in FIG. 6.

Typically, the refresh interval tREF is several μsec and tRAS is several tens seconds. Therefore, the time over which the external signal BRAS is active continuously is limited by approximately the refresh interval. The interval over which the external signal BRAS is kept active is less than at most several μsec.

In the present embodiment, a semiconductor storage apparatus having a memory capacity of approximately 1 Mbits is supposed and cell arrays 2 each having a capacity of 512 Kbits are disposed on the left and right side of the sense amplifiers 1. However, the degree of integration and the configuration of the cell arrays 2 are not restricted to those illustrated. Even if the same memory capacity of 1 Mbits is maintained, for example, four cell arrays 2 each having a memory capacity of 256 kbits may be provided.

Second Embodiment

In a second embodiment, the time over which the external signal BRAS can be kept active is made long as far as possible.

FIG. 17 is a block diagram showing a general configuration of a semiconductor storage apparatus according to the second embodiment. The semiconductor storage apparatus shown in FIG. 17 includes four cell arrays 2 that can be independently accessed. Each cell array 2 has a memory capacity of 256 kbits, and a chip has a memory capacity of 1 Mbits as a whole. The cell arrays are distinguished by row addresses A8R and A8L. The cell arrays 2 are driven by RINT0 generator 141, RINT1 generator 142, RINT2 generator 143 and RINT3 generator 144. The cell arrays 2 have their own sense amplifiers 1. Each cell array 2 can conduct the read/write operation and the refresh operation independently.

In FIG. 17, circuits of column paths and data paths are omitted for simplification.

In the present embodiment, it is not determined whether the whole chip is in the precharge state as a whole, but it is determined whether each cell array 2 is in the precharge state and the refresh operation is conducted individually for each cell array 2. Therefore, a restriction on the permissible time tRAS(rw) over which the external signal BRAS becomes active continuously is alleviated to tRAS(rw)<tREF×n+tRAS(ref)×2, whereas it was tRAS(rw)<tREF+tRAS(ref)×2 in the first embodiment. Here, tRAS(ref) is time required for the refresh operation, and n is the number of cell arrays 2.

In the semiconductor storage apparatus shown in FIG. 17, the refresh interval timer 31 and the refresh controller 34 shown in FIG. 4 are united into one body as an interval timer & controller 145. The interval timer & controller 145, the row address buffer 36 and a row address buffer controller 146 are shared by the cell arrays 2.

On the other hand, the tRAS timer 32, the address counter 33, RINT generators 141 to 144, the row address switch 37, the row path controller 38 and the row decoder 39 are provided for each of the cell arrays 2.

FIG. 18 is a block diagram showing an example of an internal configuration of the interval timer & controller 145. FIG. 19 is a timing diagram of signals generated by the interval timer & controller shown in FIG. 18.

As shown in FIG. 18, the interval timer & controller 145 includes two frequency divider circuits 151 connected in cascade. Each of these frequency divider circuits 151 is formed of, for example, a circuit similar to that shown in FIG. 8. Each of these frequency divider circuits 151 divides its input signal by two in frequency, and outputs a resultant signal. Therefore, the interval timer & controller 145 generates a signal REFCT1 having a period that is twice the period of REFCT, and a signal REFCT2 having a period that is four times the period of REFCT.

The interval timer & controller 145 includes NAND gates 152 to 155 and inverters 156 to 159 to conduct logical operations by using these divided frequency signals. As shown in FIG. 19, these four inverters generate signals REFREQ0, REFREQ1, REFREQ2 and REFREQ3 that have a cycle equivalent to four times of a cycle of the refresh request signal REFREQ and that are displaced one after another by one cycle.

Thus, in the second embodiment, a plurality of cell arrays 2 are provided and it is made possible to conduct either the refresh operation or the ordinary read/write operation individually on each cell array 2. Therefore, the restriction on the time tRAS(rw) over which the external signal BRAS becomes active continuously is alleviated considerably. In other words, tRAS(rw) can be made long by the number of the cell arrays 2 as represented by the expression tRAS(rw)<tREF×n+tRAS(ref×2. It is thus possible to provide a memory that is further better in convenience to use than the first embodiment.

If the cell array 2 is formed of FBCs 3 in the first and second embodiments, then the refresh operation needs to be conducted only for FBCs 3 storing data "0", and it is not necessary to conduct the refresh operation on FBCs 3 storing data "1". Since data "0" can be written far faster than data "1" (refresh operation), the cycle time required for the refresh operation can be made far shorter than that required for the ordinary read/write operation (ordinary operation). Therefore, the restriction on the minimum specification of the precharge time tRP for the external signal BRAS at the time of ordinary operation can be alleviated considerably. And the timing specifications for tRAS and tRP for the VSRAM of this invention can be nearly the same as those for the ordinary DRAM having no VSRAM function.

What is claimed is:

1. A semiconductor storage apparatus, comprising:
    memory cells which need a refresh operation;
    a first time measuring unit which measures a first period after the refresh operation is begun, until a next refresh operation is begun;
    a second time measuring unit which measures a second period during which the refresh operation is conducted; and
    a refresh control circuit which controls a timing of the refresh operation based on the first period, the second period and a precharge signal,
    wherein when the precharge signal changes from a first logic level to a second logic level during the refresh operation of the memory cells to request external access for reading out from or writing into the memory cells, the refresh control circuit suspends the refresh operation until the external access is completed, and then when the precharge signal changes from the second logic level to the first logic level, the refresh control circuit completes the refresh operation during a period when the precharge signal is at the first logic level.

2. The semiconductor storage apparatus according to claim 1, wherein when the refresh operation is suspended at a suspended address in accordance with the request for external access, the refresh control circuit begins the refresh operation from the suspended address, and afterwards the refresh operation is resumed.

3. The semiconductor storage apparatus according to claim 1, wherein the first time measuring unit includes:
    a ring oscillator;
    a bias circuit which supplies a bias voltage or a bias current to the ring oscillator; and
    an output circuit which generates a signal for regulating the first period based on the output signal of the ring oscillator.

4. The semiconductor storage apparatus according to claim 1, wherein the refresh control circuit outputs a count indication signal which regulates refresh timings of the memory cells to be refreshed; and
    the apparatus further comprises an address generator having a plurality of divider circuits connected in series which generate refresh addresses based on the count indicating signal.

5. The semiconductor storage apparatus according to claim 1, further comprising:
    a refresh timing adjustment circuit which generates a refresh timing adjustment signal for adjusting a timing of a refresh period, based on an external access request signal and a refresh request signal,
    wherein the refresh control circuit controls the refresh operation based on the refresh timing adjustment signal.

6. The semiconductor storage apparatus according to claim 5, wherein the refresh timing adjustment circuit generates the refresh timing adjustment signal with respect to the case where the refresh request signal becomes active while the external access request signal is active, the case where the external access request signal becomes active during the refresh operation, and the case where the external access request signal becomes active after completing the refresh operation.

7. The semiconductor storage apparatus according to claim 1, further comprising:
   a plurality of cell arrays each having its own refresh control circuit and capable of individually conducting refresh, each having a plurality of memory cells,
   wherein each refresh control circuit determines individually operating state of the associated cell array, and controls whether to conduct refresh of the cell array.

8. The semiconductor storage apparatus according to claim 7, further comprising sense amplifiers which are disposed between two cell arrays adjacent to each other and sense data read out from memory cells.

9. The semiconductor storage apparatus according to claim 1, wherein the memory cells are FBCs (Floating Body Cells).

10. A semiconductor storage apparatus comprising:
    memory cells which need a refresh operation;
    a first time measuring unit which measures a first period after the refresh operation is begun, until a next refresh operation is begun;
    a second time measuring unit which measures a second period during which the refresh operation is conducted; and
    a refresh control circuit which controls a timing of the refresh operation based on the first period, the second period and a precharge signal,
    wherein when the refresh operation is requested during external access for reading out from or writing into the memory cells, the refresh control circuit does not begin the refresh operation until the external access is completed, and after the external access is completed and the precharge signal becomes a predetermined logic level, the refresh control circuit begins the refresh operation and completes the refresh operation during a period when the precharge signal is at the predetermined logic level.

11. The semiconductor storage apparatus according to claim 10, wherein when the refresh operation is suspended at a suspended address in accordance with the request for external access, the refresh control circuit begins the refresh operation from the suspended address, and afterwards the refresh operation is resumed.

12. The semiconductor storage apparatus according to claim 10, wherein the first time measuring unit includes:
    a ring oscillator;
    a bias circuit which supplies a bias voltage or a bias current to the ring oscillator; and
    an output circuit which generates a signal for regulating the first period based on the output signal of the ring oscillator.

13. The semiconductor storage apparatus according to claim 10, wherein the refresh control circuit outputs a count indication signal which regulates refresh timings of the memory cells to be refreshed; and
    the apparatus further comprises an address generator having a plurality of divider circuits connected in series which generate refresh addresses based on the count indicating signal.

14. The semiconductor storage apparatus according to claim 10, further comprising:
    a refresh timing adjustment circuit which generates a refresh timing adjustment signal for adjusting a timing of a refresh period, based on an external access request signal and a refresh request signal,
    wherein the refresh control circuit controls the refresh operation based on the refresh timing adjustment signal.

15. The semiconductor storage apparatus according to claim 14, wherein the refresh timing adjustment circuit generates the refresh timing adjustment signal with respect to the case where the refresh request signal becomes active while the external access request signal is active, the case where the external access request signal becomes active during the refresh operation, and the case where the external access request signal becomes active after completing the refresh operation.

16. The semiconductor storage apparatus according to claim 10, further comprising:
    a plurality of cell arrays each having its own refresh control circuit and capable of individually conducting refresh, each having a plurality of memory cells,
    wherein each refresh control circuit determines individually operating state of the associated cell array, and controls whether to conduct refresh of the cell array.

17. The semiconductor storage apparatus according to claim 16, further comprising sense amplifiers which are disposed between two cell arrays adjacent to each other and sense data read out from memory cells.

18. The semiconductor storage apparatus according to claim 10, wherein the memory cells are FBCs (Floating Body Cells).

* * * * *